United States Patent
Wang et al.

(10) Patent No.: US 11,114,134 B2
(45) Date of Patent: Sep. 7, 2021

(54) STORAGE DEVICE AND ITS HOLDING BRACKET

(71) Applicant: CHENBRO MICOM CO., LTD., New Taipei (TW)

(72) Inventors: Chien-Wen Wang, New Taipei (TW); Tung-Yang Hu, New Taipei (TW); Cheng-Yung Tsai, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 16/879,784

(22) Filed: May 21, 2020

(65) Prior Publication Data
US 2020/0372938 A1   Nov. 26, 2020

(30) Foreign Application Priority Data
May 24, 2019   (TW) .................................. 108206616

(51) Int. Cl.
*G11B 33/02*   (2006.01)
*H05K 7/14*   (2006.01)
*G11B 33/12*   (2006.01)

(52) U.S. Cl.
CPC .......... *G11B 33/022* (2013.01); *G11B 33/124* (2013.01); *G11B 33/128* (2013.01); *H05K 7/1488* (2013.01)

(58) Field of Classification Search
None
See application file for complete search history.

(56) References Cited

U.S. PATENT DOCUMENTS

2015/0049429 A1   2/2015   Zhu

FOREIGN PATENT DOCUMENTS

| TW | M455242 U | 6/2013 |
| TW | M516213 U | 1/2016 |
| TW | M527670 U | 8/2016 |

*Primary Examiner* — Craig A. Renner
(74) *Attorney, Agent, or Firm* — CKC & Partners Co., LLC (57) ABSTRACT

A holding bracket includes a frame body, an elastic rib, a stopping block and a cover plate. The frame body is formed with a holding space for holding a loaded object such as a hard disk. One end of the elastic rib is connected to the frame body, and the other end is a free end. The stopping block is protrusively formed on one surface of the elastic rib facing away from the holding space, and is located at the free end. The cover plate is pivotally connected to one end of the frame body.

10 Claims, 8 Drawing Sheets

STORAGE DEVICE AND ITS HOLDING BRACKET

CROSS-REFERENCE TO RELATED APPLICATION

This application claims priority to Taiwan Application Serial Number 108206616, filed on May 24, 2019, which is herein incorporated by reference.

BACKGROUND

Technical Field

The present disclosure relates to a holding bracket. More particularly, the present disclosure relates to a holding bracket of a storage device.

Description of Related Art

An existing server chassis may load with multiple removable hard disks for storing a relatively large amount of data, thereby expanding the functions of the server. These removable hard disks are exchangeable on the server chassis so as to hot swap one of the removable hard disks.

The current server chassis uses a trayless-design structure for loading these removable hard disks. However, the process of removing the trayless-design structure from the server chassis is quite time-consuming, thereby resulting in many inconveniences and troubles.

Therefore, how to develop a solution to improve the foregoing deficiencies and inconvenience is an urgent and important issue for related industry.

SUMMARY

One aspect of the present disclosure is to provide a storage device and its holding bracket to solve the aforementioned problems of the prior art.

In one embodiment of the disclosure, the holding bracket includes a frame body, an elastic rib, a stopping block and a cover plate. The frame body includes a strip-shaped plate and a plurality of side portions. The strip-shaped plate is formed with a breach. The side portions are respectively connected to a plurality of sides of the strip-shaped plate, and extend towards a same direction such that a holding space that is connected to the breach is formed by the strip-shaped plate and the side portions mutually for holding a loaded object. The elastic rib is connected to the strip-shaped plate with one end thereof, and the other end of the elastic rib includes a free end portion extending into the breach. The stopping block is protrusively formed on one surface of the elastic rib facing away from the holding space, and located at the free end portion. The cover plate is pivotally connected to one end of the frame body.

According to one or more embodiments of the disclosure, in the foregoing holding bracket, the surface of the elastic rib facing away from the holding space is coplanar to one surface of the strip-shaped plate facing away from holding space.

According to one or more embodiments of the disclosure, in the foregoing holding bracket, the stopping block, the elastic rib and the strip-shaped plate are formed integrally.

According to one or more embodiments of the disclosure, in the foregoing holding bracket, the elastic rib is fixed on the frame body through a locking element.

According to one or more embodiments of the disclosure, in the foregoing holding bracket, the elastic rib is an arc-shaped piece, and the free end portion of the elastic rib is located between two opposite ones of the side portions.

According to one or more embodiments of the disclosure, the foregoing holding bracket further includes at least one hanging portion that is disposed on one surface of the strip-shaped plate facing away from holding space.

In one embodiment of the disclosure, a storage device includes a chassis and a holding bracket. The chassis includes a first partition member, a second partition member and a receiving recess formed between the second partition member and the first partition member. The first partition member that is formed with a sliding slot having an elongated groove and a detaching opening. The detaching opening is connected to the elongated groove and the receiving recess. A width of the detaching opening is greater than a width of the elongated groove. The holding bracket includes a frame body, a hanging portion, an elastic rib and a stopping block. The frame body is located within the receiving recess, and formed with a holding space. The hanging portion is fixedly connected to the frame body, and slidably disposed within the sliding slot. The elastic rib is connected to the holding bracket with one end thereof, and the other end of the elastic rib includes a free end portion. The stopping block is protrusively formed on the free end portion, and slidably disposed within the sliding slot. When the stopping block is moved to the detaching opening to be blocked by an inner side of the detaching opening, the holding bracket is restricted within the receiving recess. When the elastic rib is bent to move the stopping block away from the detaching opening, the holding bracket is separable from the receiving recess.

According to one or more embodiments of the disclosure, in the foregoing storage device, the frame body includes a strip-shaped plate, a pivoting portion and a plurality of side portions. The pivoting portion is disposed on one end of the strip-shaped plate, and the stopping block is arranged between the pivoting portion and the hanging portion. The side portions are respectively connected to a plurality of sides of the strip-shaped plate and extend towards a same direction. The holding space is formed by the strip-shaped plate and the side portions mutually. The holding bracket further includes a cover plate pivotally connected to the strip-shaped plate through the pivoting portion for covering the receiving recess.

According to one or more embodiments of the disclosure, in the foregoing storage device, the strip-shaped plate is penetrated through with a breach, and the breach is connected to the holding space, and the free end portion of the elastic rib extends into the breach. One surface of the elastic rib facing away from the holding space is coplanar to one surface of the strip-shaped plate facing away from holding space.

According to one or more embodiments of the disclosure, in the foregoing storage device, the elastic rib is an arc-shaped piece, and the free end portion of the elastic rib is located between two opposite ones of the side portions.

Thus, based on the embodiments above, when a user is desired to pull the holding bracket away from the receiving recess of the chassis, as long as the elastic rib is pulled away to be disengaged from the detaching opening, the user is allowed to withdraw the holding bracket away from the chassis. Therefore, once the hanging portion leaves the sliding slot from the detaching opening, the holding bracket is allowed to be moved out of the receiving recess. Therefore, it is convenient for subsequent replacement and maintenance of the bracket.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the disclosure and, together with the description, serve to explain the principles of the disclosure. In the drawings.

DETAILED DESCRIPTION

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 1:
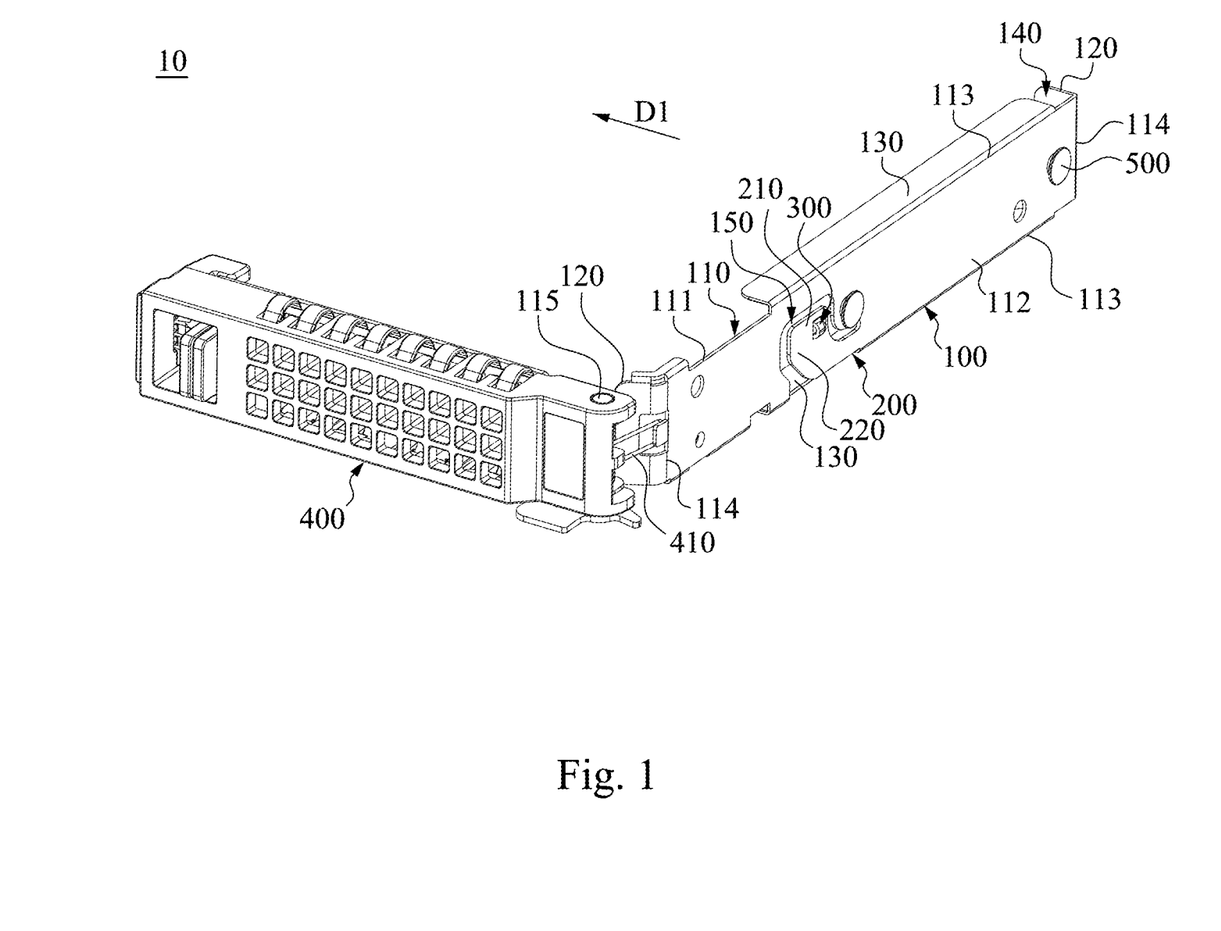
FIG. 1 is a perspective schematic view of a holding bracket according to one embodiment of present disclosure.

Reference is now made to FIG. 1 in which FIG. 1 is a perspective schematic view of a holding bracket 10 according to one embodiment of present disclosure. As shown in FIG. 1, in one embodiment, the holding bracket 10 includes a frame body 100, an elastic rib 200, a stopping block 300 and a cover plate 400. One side of the frame body 100 is formed with a holding space 140. The holding space 140 is used to hold a loaded object. One end of the elastic rib 200 is connected to the frame body 100, and the other end of the elastic rib 200 includes a free end portion 210. The stopping block 300 is disposed on the elastic rib 200. The cover plate 400 is connected to the frame body 100. Thus, when the free end portion 210 of the elastic rib 200 is pulled, the stopping block 300 is synchronized with the movement of the elastic rib 200.

More specifically, the frame body 100 includes a strip-shaped plate 110, a pivoting portion 115, two first side portions 120 and two second side portions 130. The strip-shaped plate 110 includes a front surface 111, a rear surface 112, two long sides 113 and two short sides 114. The front surface 111 and the rear surface 112 are opposite to each other, the long sides 113 are opposite to each other, and the short sides 114 are opposite to each other, and both of the front surface 111 and the rear surface 112 are surrounded by the long sides 113 and the short sides 114 collectively. Each of the long sides 113 is located between the short sides 114, and respectively adjoins the short sides 114. Each of the short sides 114 is located between the long sides 113, and respectively adjoins the long sides 113. The first side portions 120 are respectively located at two opposite ends of the strip-shaped plate 110, that is, respectively located at the short sides 114 of the strip-shaped plate 110. The second side portions 130 are respectively located at the long sides 113 of the strip-shaped plate 110. Both of the first side portions 120 and the second side portions 130 extend in the same direction D1, so that the aforementioned holding space 140 is collectively defined by the strip-shaped plate 110, the first side portions 120 and the second side portions 130. The pivoting portion 115 is disposed on one of the first side portions 120 so that the cover plate 400 is pivotally connected to the frame body 100 through the pivoting portion 115. The strip-shaped plate 110 includes a breach 150. The breach 150 penetrates through the front surface 111 and the rear surface 112 to communicates with the holding space 140, and connected to one of the long sides 113 of the strip-shaped plate 110. One end of the elastic rib 200 is connected to the strip-shaped plate 110, and the free end portion 210 of the elastic rib 200 located at the other end extends into the breach 150. For example, the elastic rib 200 is an arc-shaped piece 220. A side edge of the arc-shaped piece 220 away from the free end portion 210 is connected to one of the second side portions 130, and extends into the breach 150. However, the disclosure is not limited to the free end portion 210 of the elastic rib 200 must give way to the breach 150.

One surface of the elastic rib 200 facing away from the holding space 140 and the rear surface 112 of the strip-shaped plate 110 are coplanar with each other. That is, the surface of the elastic rib 200 facing away from the holding space 140 and the back surface of the strip-shaped plate 110 are substantially in the same plane. The stopping block 300 is located on a surface of the elastic rib 200 facing away from the holding space 140. More specifically, one surface of the elastic rib 200 facing away from the holding space 140 is coplanar to the rear surface 112 of the strip-shaped plate 110, that is, the surface of the elastic rib 200 facing away from the holding space 140 and the rear surface 112 of the strip-shaped plate 110 are substantially located at the same plane. The stopping block 300 is located on a surface of the elastic rib 200 facing away from the holding space 140. More specifically, the stopping block 300 is protrudingly formed on the free end portion 210.

Furthermore, in the embodiment, the stopping block 300, the elastic rib 200 and the strip-shaped plate 110 are formed integrally. However, the disclosure is not limited thereto. In other embodiments, at least any two of the stopping block, the elastic rib, and the strip-shaped plate may also be different elements, and are fixed to each other through the locking element. For example, the stopping block 300 may also be a bolt screwed on the elastic rib.

In this embodiment, but not limited thereto, the holding bracket 10 further includes an elastic element 410. The elastic element 410 is located on the pivoting portion 115, and abuts the cover plate 400 and the strip-shaped plate 110, the elastic element 410 returns The elastic force is used to bring the cover plate 400 back to the original position. The resilience of the elastic element 410 forces the cover plate 400 back to the original position of the cover plate 400.

Also, the holding bracket 10 further includes at least one (e.g., two) hanging portion 500 that is disposed on the rear surface 112 of the strip-shaped plate 110. The stopping block 300 is located between the cover plate 400 and the hanging portion 500. The hanging portion 500 is, for example, a T-nail. Therefore, the holding bracket 10 is allowed to be hung on any stationary member through the hanging portion 500.

Figure 2A:
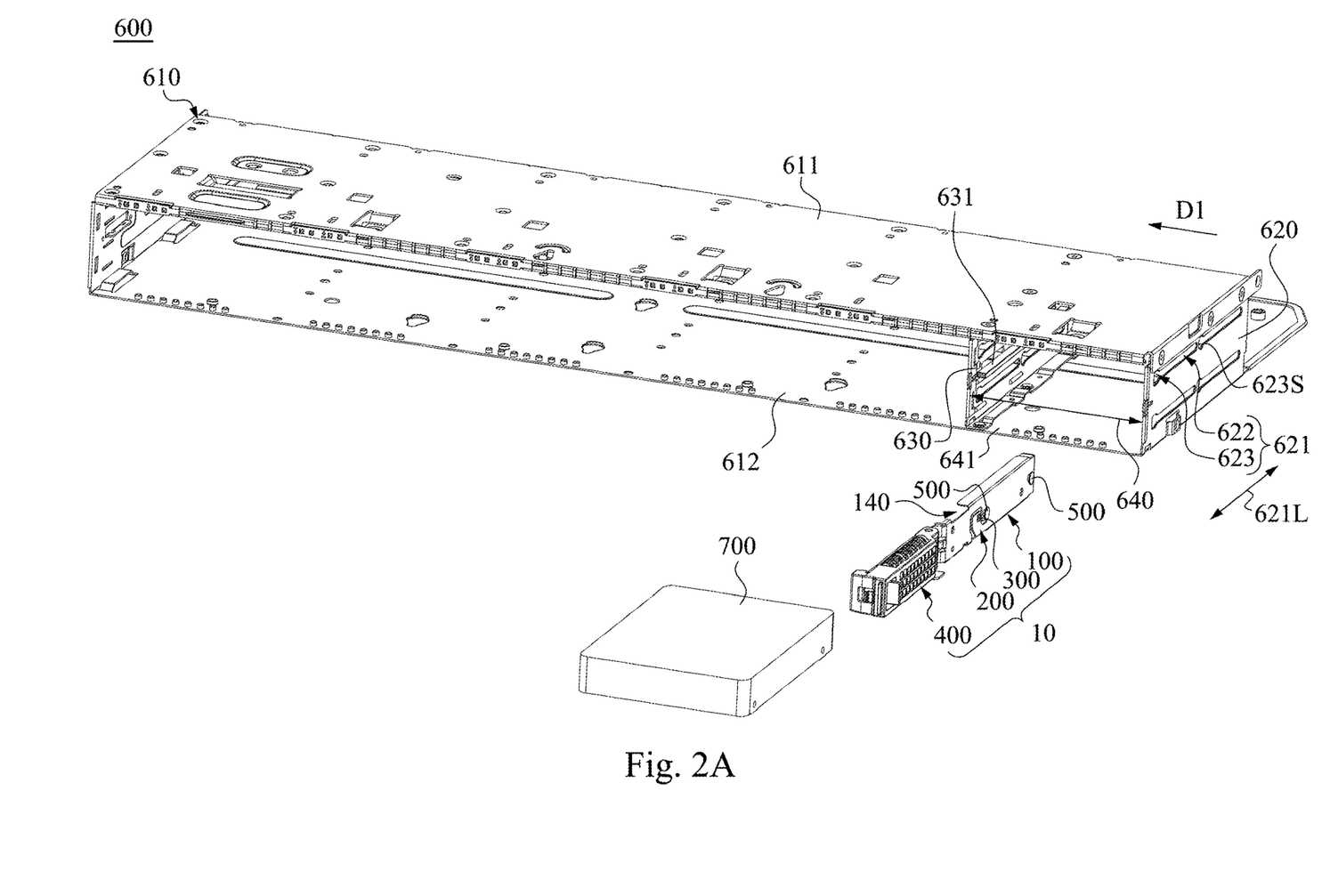
FIG. 2A is a partial exploded view of the storage device according to one embodiment of present disclosure.
Figure 2B:
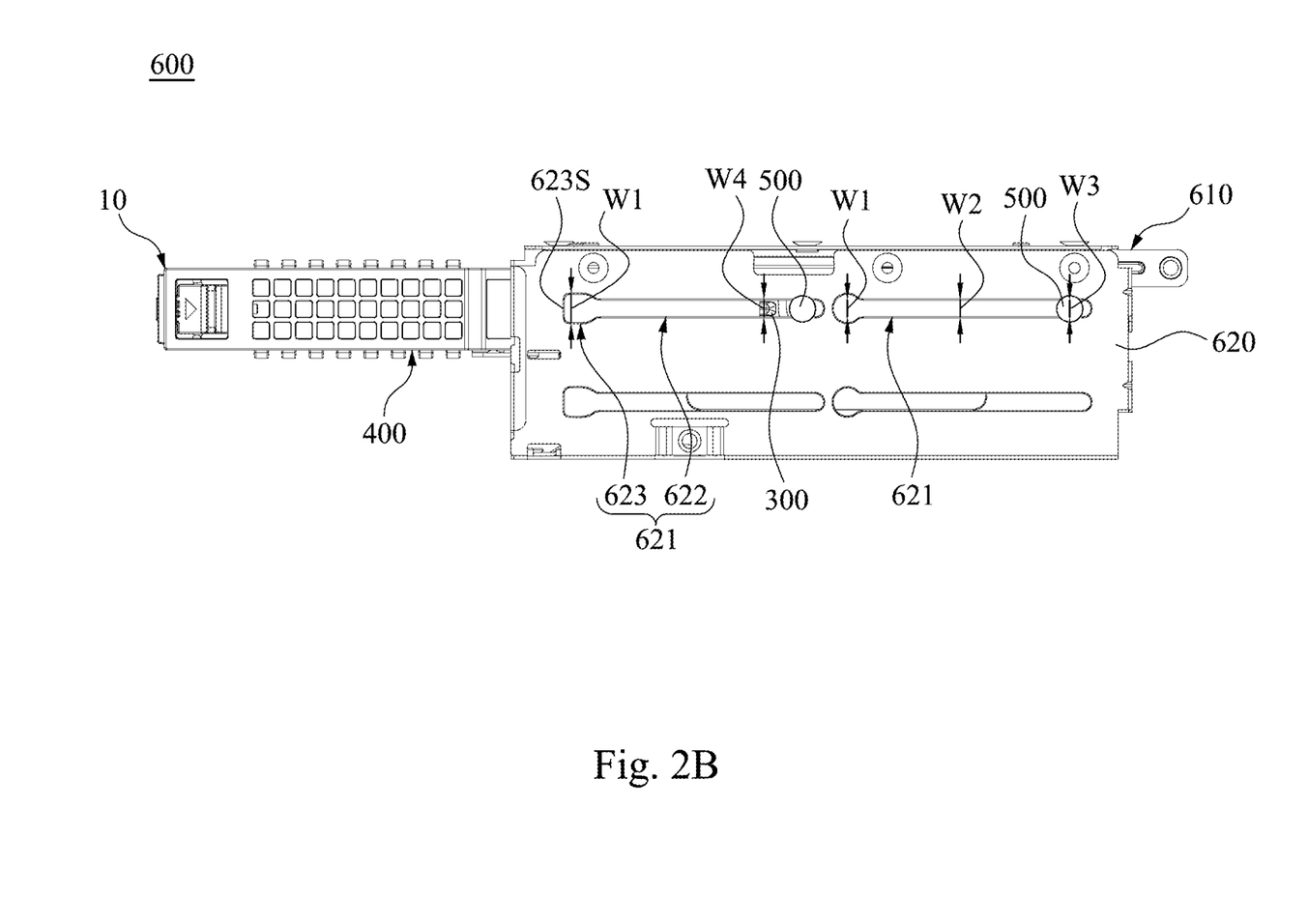
FIG. 2B is a schematic view of the first partition member viewed in a direction D1 in FIG. 2A.

FIG. 2A is a partial exploded view of the storage device 600 according to one embodiment of present disclosure. FIG. 2B is a schematic view of the first partition member viewed in a direction D1 in FIG. 2A. As shown in FIG. 2A and FIG. 2B, the storage device 600 includes a chassis 610. The chassis 610 includes a top plate 611, a bottom plate 612, a first partition member 620 and a second partition member 630. The top plate 611 and the bottom plate 612 are opposite to each other. The first partition member 620 and the second partition member 630 respectively are interposed between the top plate 611 and the bottom plate 612 so that a receiving recess 640 is formed between the first partition member 620 and the second partition member 630. The first partition member 620 and the second partition member 630, for example respectively are plates or racks etc. The first partition member 620 is formed with at least one (e.g., two) sliding slots 621. Each of the sliding slots 621 includes an elongated groove 622 and a detaching opening 623. The detaching opening 623 is arranged at one end of the elongated groove 622, and the detaching opening 623 is connected to the elongated groove 622 and the receiving recess 640, and the detaching opening 623 is located between the elongated groove 622 and a recess outlet 641 of the receiving recess 640. Furthermore, a width W1 of the detaching opening 623 is greater than a width W2 of the elongated groove 622, and the width W1 of the detaching opening 623 is not less than the maximum width W3 of the hanging portion 500 and the maximum width W4 of the stopping block 300. The second partition member 630 includes a bearing rib 631 that extends toward the first partition member 620.

The holding bracket 10 is located within the receiving recess 640, and is linearly and slidably located on the inner wall of the first partition member 620. More specifically, the hanging portion 500 of the holding bracket 10 is slidably located within one of the sliding slots 621, and the stopping block 300 is slidably located in the sliding slot 621 and interposed between the cover plate 400 and the hanging portion 500. In other words, the hanging portion 500 and the stopping block 300 are linearly arranged in the sliding slots 621 in sequence (FIG. 2B). Therefore, through the cooperation of the hanging portion 500 and the sliding slot 621, the holding bracket 10 is allowed to lead the aforementioned loaded object 700 to slide reciprocatedly in the receiving recess 640. It is noted, when the loaded object 700 is moved into the receiving recess 640, one side of the loaded object 700 is held in the holding space 140 of the holding bracket 10, and the other side of the loaded object 700 opposite to the holding bracket 10 is disposed on the bearing rib 631.

Figure 3A:
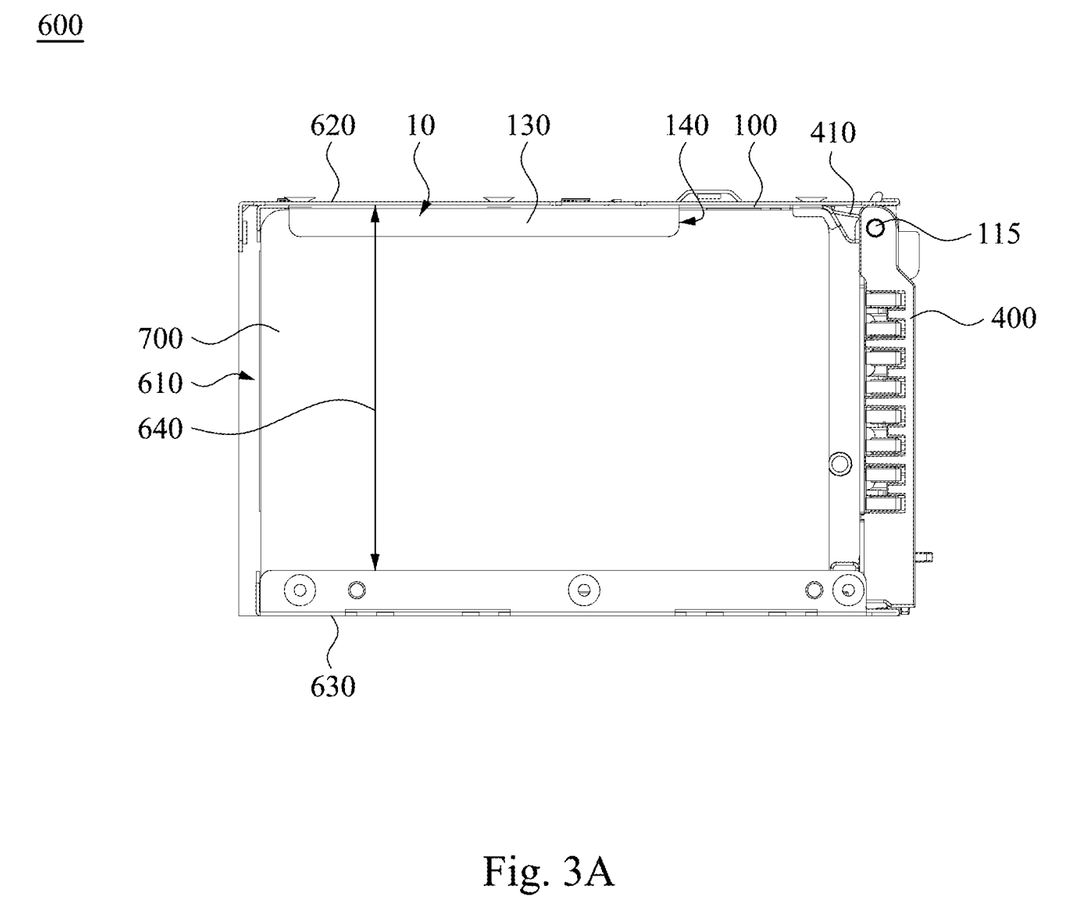
FIG. 3A is a schematic view of the holding bracket of FIG. 2B being moved into the chassis.
Figure 3B:
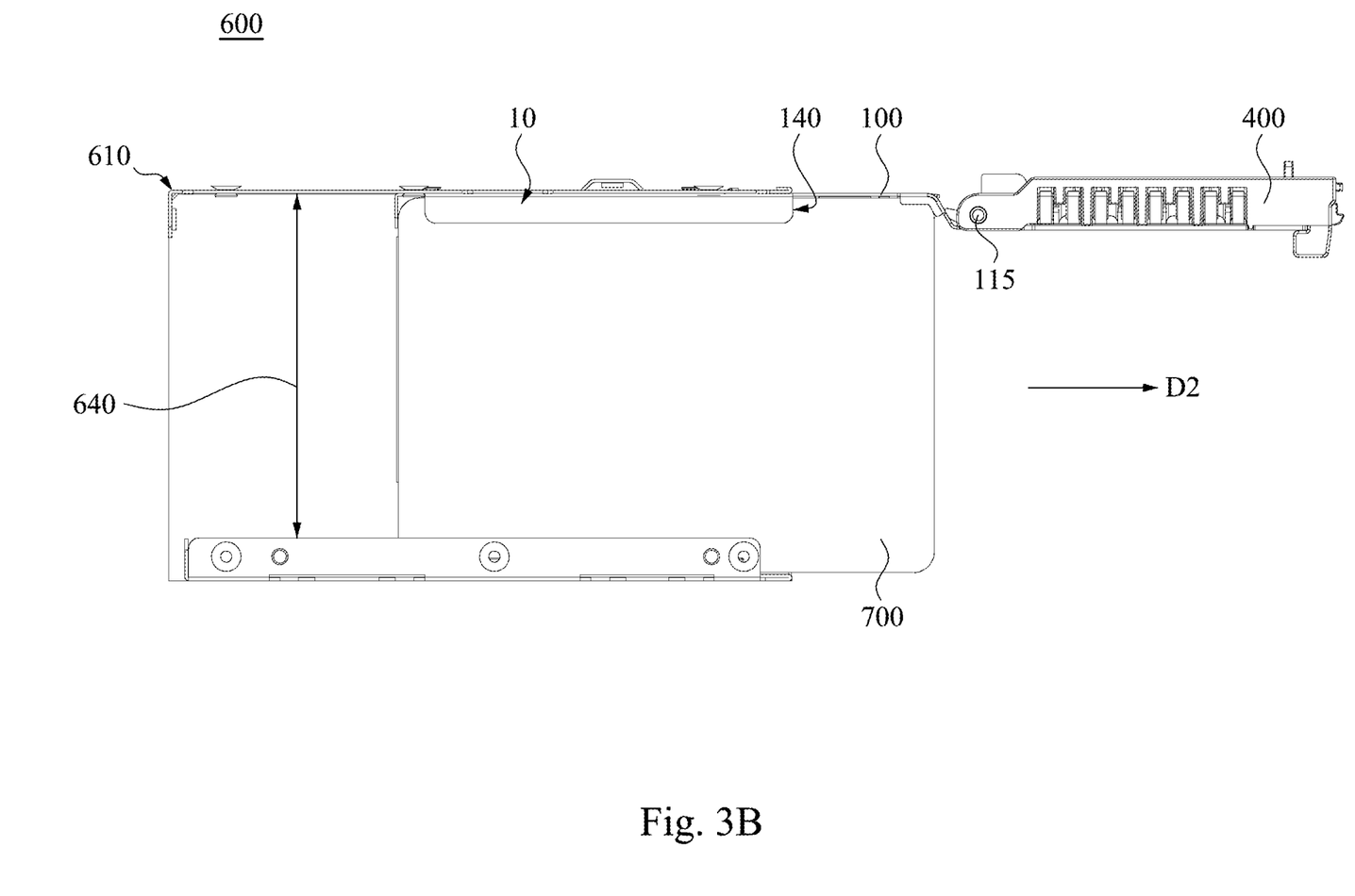
FIG. 3B is a schematic view of the holding bracket of FIG. 2B being partially pulled out of the chassis.

FIG. 3A is a schematic view of the holding bracket 10 of FIG. 2B being moved into the chassis 610. Therefore, as shown in FIG. 2B and FIG. 3A, when the frame body 100 of the holding bracket 10 is fully returned into the receiving recess 640 along the long axis direction 621L of the corresponding sliding slot 621, the cover plate 400 is able to cover the receiving recess 640, and fastened on the chassis 610. On the contrary, FIG. 3B is a schematic view of the holding bracket 10 of FIG. 2B being partially pulled out of the chassis 610. As shown in FIG. 2A and FIG. 3B, when the cover plate 400 is opened from the chassis 610 so that the resilience of the elastic element 410 automatically pushes the cover plate 400 away from the receiving recess 640, the user is allowed to pull the holding bracket 10 out of the receiving recess 640 along the long axis direction 621L of the corresponding sliding slot 621 by using the cover plate 400 as a handle. However, in the disclosure, the cover plate is not an essential element of the holding bracket. In other embodiments, the user can also pull the holding bracket out of the receiving recess by one end of the frame body.

Figure 4A:
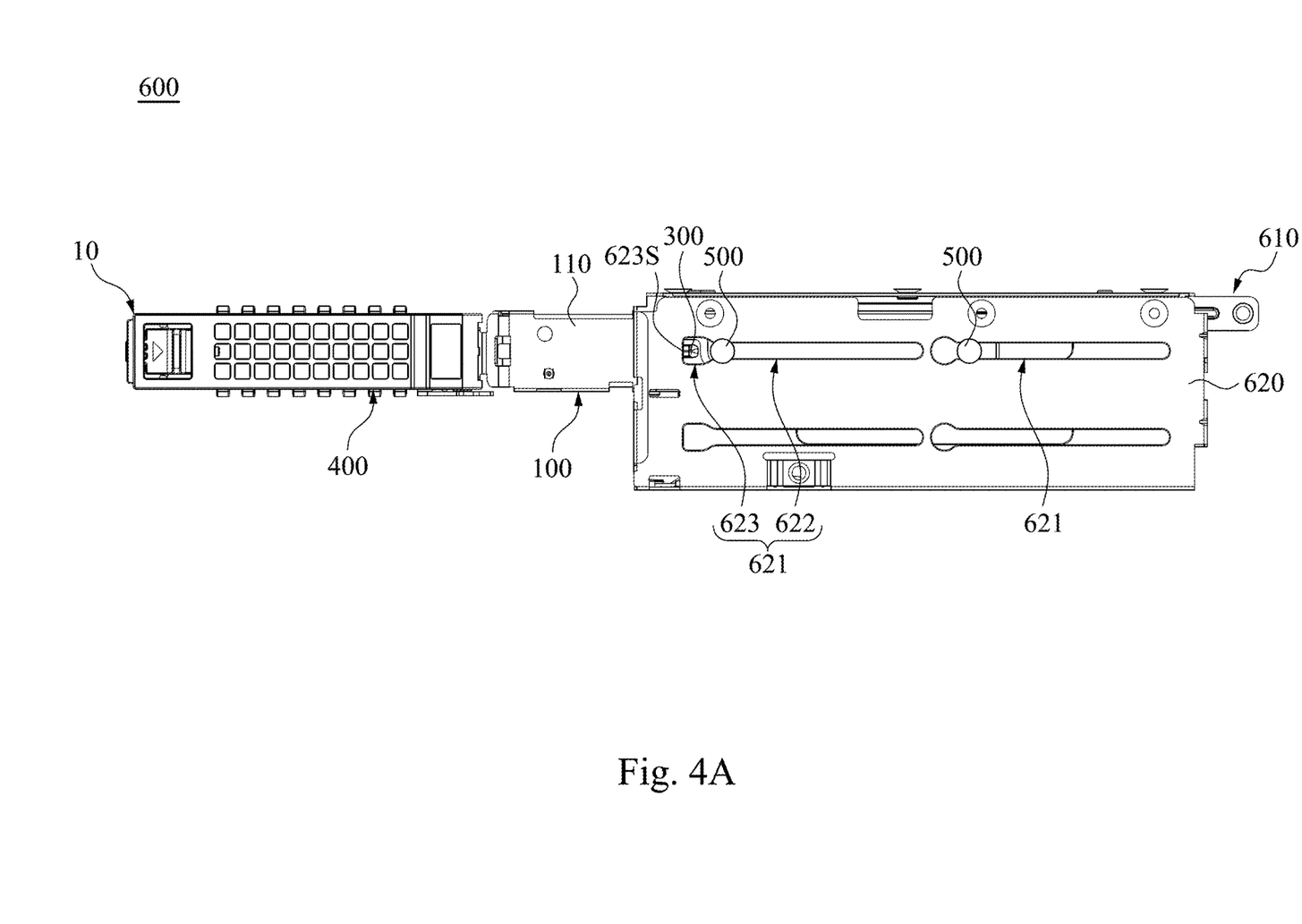
FIG. 4A to FIG. 4C are continuous operational schematic views of the holding bracket being detached from the chassis of FIG. 3B.
Figure 4B:
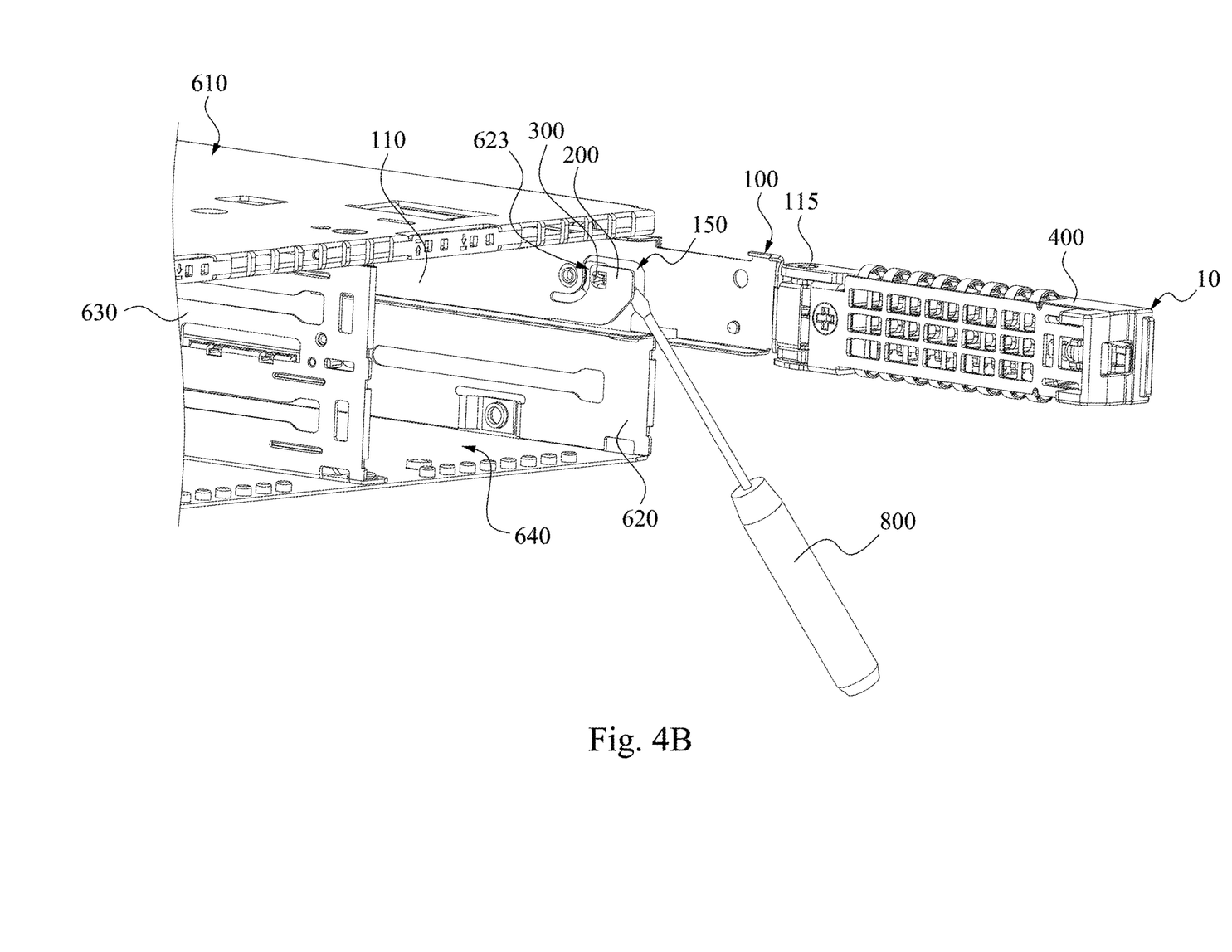
Figure 4C:
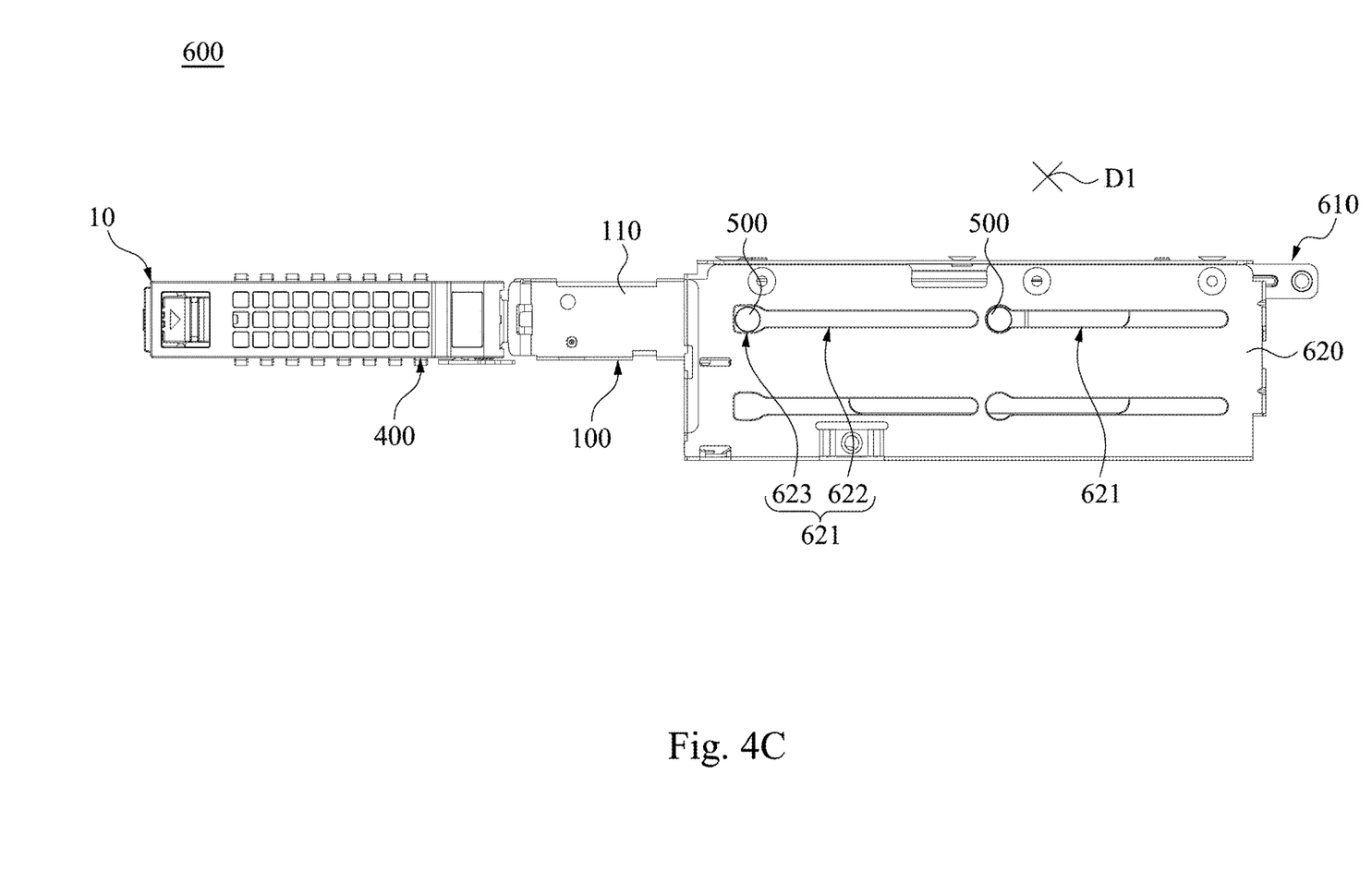

FIG. 4A to FIG. 4C are continuous operational schematic views of the holding bracket 10 being detached from the chassis 610 of FIG. 3B. As shown in FIG. 4A and FIG. 4B, when the user pulls the holding bracket 10 out of the receiving recess 640, and the stopping block 300 is moved to the detaching opening 623 through the elongated groove 622, since the stopping block 300 is blocked by an inner side 623S of the detaching opening 623, the holding bracket 10 cannot completely leave the receiving recess 640, and thus is continued to be restricted within the receiving recess 640.

As shown in FIG. 4B, after the loaded object 700 is removed, when the user is desired to completely detach the holding bracket 10 away from the receiving recess 640, the user pulls the elastic rib 200 with a tool 800 so that the free end portion 210 of the elastic rib 200 is bent towards a direction facing away from the detaching opening 623, such that the stopping block 300 is synchronized to move out from the detaching opening 623 with the movement of the elastic rib 200. As shown in FIG. 4B, next, the hanging portion 500 is moved outside the receiving recess 640 in a drawing direction D2, so that the user can disengage the hanging portion 500 of the holding bracket 10 from the sliding slots 621 via the detaching opening 623. In this way, the entire holding bracket 10 can be released from the restriction of the sliding slot 621, so as to completely separable from the receiving recess 640.

Although the loaded object 700 described in all of the above embodiments may be a bare hard disk, the disclosure is not limited to the types of the loaded object that the holding bracket 10 can hold.

Thus, based on the embodiments above, when a user is desired to pull the holding bracket away from the receiving recess of the chassis, as long as the elastic rib is pulled away to be disengaged from the detaching opening, the user is allowed to withdraw the holding bracket away from the chassis. Therefore, once the hanging portion leaves the sliding slot from the detaching opening, the holding bracket is allowed to be moved out of the receiving recess. Therefore, it is convenient for subsequent replacement and maintenance of the bracket.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A holding bracket, comprising:
   a frame body comprising a strip-shaped plate having a breach, and a plurality of side portions respectively connected to a plurality of sides of the strip-shaped plate and extending towards a same direction such that a holding space that is connected to the breach is formed by the strip-shaped plate and the side portions mutually for holding a loaded object;
   an elastic rib connected to the strip-shaped plate with one end thereof, and the other end of the elastic rib comprising a free end portion extending into the breach;

a stopping block protrusively formed on one surface of the elastic rib facing away from the holding space, and located at the free end portion; and a cover plate pivotally connected to one end of the frame body.

2. The holding bracket of claim 1, wherein the surface of the elastic rib facing away from the holding space is coplanar to one surface of the strip-shaped plate facing away from the holding space.

3. The holding bracket of claim 1, wherein the stopping block, the elastic rib and the strip-shaped plate are formed integrally.

4. The holding bracket of claim 1, wherein the elastic rib is fixed on the frame body through a locking element.

5. The holding bracket of claim 1, wherein the elastic rib is an arc-shaped piece, and the free end portion of the elastic rib is located between two opposite ones of the side portions.

6. The holding bracket of claim 1, further comprising:
at least one hanging portion disposed on one surface of the strip-shaped plate facing away from the holding space.

7. A storage device, comprising:
a chassis comprising a first partition member, a second partition member and a receiving recess formed between the second partition member and the first partition member, the first partition member that is formed with a sliding slot having an elongated groove and a detaching opening, the detaching opening that is connected to the elongated groove and the receiving recess, wherein a width of the detaching opening is greater than a width of the elongated groove; and
a holding bracket, comprising:
a frame body located within the receiving recess, and formed with a holding space;
a hanging portion fixedly connected to the frame body, and slidably disposed within the sliding slot;
an elastic rib connected to the frame body with one end thereof, and the other end of the elastic rib comprising a free end portion; and
a stopping block protrusively formed on the free end portion, and slidably disposed within the sliding slot,
wherein when the stopping block is moved to the detaching opening to be blocked by an inner side of the detaching opening, the holding bracket is restricted within the receiving recess,
when the elastic rib is bent to move the stopping block away from the detaching opening, the holding bracket is separable from the receiving recess.

8. The storage device of claim 7, wherein the frame body comprises:
a strip-shaped plate;
a pivoting portion disposed on one end of the strip-shaped plate, wherein the stopping block is arranged between the pivoting portion and the hanging portion; and
a plurality of side portions respectively connected to a plurality of sides of the strip-shaped plate and extending towards a same direction, wherein the holding space is formed by the strip-shaped plate and the side portions mutually; and
the holding bracket further comprises a cover plate pivotally connected to the strip-shaped plate through the pivoting portion for covering the receiving recess.

9. The storage device of claim 8, wherein the strip-shaped plate is penetrated through with a breach, and the breach is connected to the holding space, and the free end portion of the elastic rib extends into the breach,
wherein one surface of the elastic rib facing away from the holding space is coplanar to one surface of the strip-shaped plate facing away from the holding space.

10. The storage device of claim 8, wherein the elastic rib is an arc-shaped piece, and the free end portion of the elastic rib is located between two opposite ones of the side portions.

* * * * *